US011295977B2

(12) United States Patent
Boemmels et al.

(10) Patent No.: US 11,295,977 B2
(45) Date of Patent: Apr. 5, 2022

(54) STANDARD CELL DEVICE AND METHOD OF FORMING AN INTERCONNECT STRUCTURE FOR A STANDARD CELL DEVICE

(71) Applicant: IMEC vzw, Leuven (BE)

(72) Inventors: Juergen Boemmels, Heverlee (BE); Julien Ryckaert, Schaerbeek (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/844,442

(22) Filed: Apr. 9, 2020

(65) Prior Publication Data
US 2020/0328109 A1   Oct. 15, 2020

(30) Foreign Application Priority Data
Apr. 10, 2019 (EP) ..................... 19168362

(51) Int. Cl.
*H01L 21/768* (2006.01)
*G06F 30/392* (2020.01)
*H01L 23/522* (2006.01)

(52) U.S. Cl.
CPC ...... *H01L 21/76802* (2013.01); *G06F 30/392* (2020.01); *H01L 21/76877* (2013.01); *H01L 23/5226* (2013.01)

(58) Field of Classification Search
CPC ........... H01L 27/0207; H01L 21/76877; H01L 21/76885; H01L 29/6656
See application file for complete search history.

(56) References Cited

U.S. PATENT DOCUMENTS 9,793,164 B2 * 10/2017 Machkaoutsan ........................... H01L 21/76808
9,799,560 B2 * 10/2017 Song .................. H01L 27/0886
(Continued)

FOREIGN PATENT DOCUMENTS

WO    WO 2016/205516 A1    12/2016

OTHER PUBLICATIONS

Extended European Search Report dated Nov. 5, 2019, in European Application No. 19168362.2.

*Primary Examiner* — Nicholas J Tobergte
*Assistant Examiner* — William Henry Anderson
(74) *Attorney, Agent, or Firm* — Knobbe Martens Olson & Bear LLP

(57) ABSTRACT

A method of forming an interconnect structure for a standard cell semiconductor device is disclosed. In one aspect, the method includes forming metal lines along respective routing tracks, wherein forming the metal lines includes depositing, on a first dielectric layer covering the active regions of the cell, a metal layer and a capping layer on the metal layer; patterning the capping layer and the metal layer to form first and second capped off-center metal lines extending along first and second off-center tracks, respectively; forming spacer lines on sidewalls of the capped off-center metal lines; and embedding the spacer-provided capped off-center metal lines in a second dielectric layer. The method further includes patterning a set of trenches in the second dielectric layer. The set of trenches includes a center trench extending along a center track between the spacer-provided capped off-center lines, and a first and a second edge trench extending along first and second edge tracks, respectively, on mutually opposite outer sides of the spacer-provided capped off-center metal lines. The method further includes forming a center metal line in the center trench, and a first and a (Continued)

second edge metal line in the first and second edge trenches, respectively.

13 Claims, 15 Drawing Sheets

(56) References Cited

U.S. PATENT DOCUMENTS

| | | | |
|---|---|---|---|
| 10,818,762 B2* | 10/2020 | Schultz | H01L 21/76895 |
| 2005/0191813 A1* | 9/2005 | Seo | H01L 29/78 |
| | | | 438/301 |
| 2011/0113393 A1 | 5/2011 | Sezginer | |
| 2014/0225270 A1 | 8/2014 | Yuan et al. | |
| 2016/0247714 A1 | 8/2016 | Song et al. | |
| 2016/0254256 A1 | 9/2016 | Baek et al. | |
| 2017/0083653 A1 | 3/2017 | Sahu et al. | |
| 2017/0256484 A1 | 9/2017 | Shen et al. | |
| 2018/0006010 A1 | 1/2018 | Lo et al. | |
| 2018/0033729 A1 | 2/2018 | Xu et al. | |
| 2018/0108663 A1* | 4/2018 | Yoon | H01L 27/1104 |
| 2018/0158811 A1* | 6/2018 | Subhash | H01L 27/11807 |
| 2019/0096909 A1 | 3/2019 | Chen et al. | |

* cited by examiner

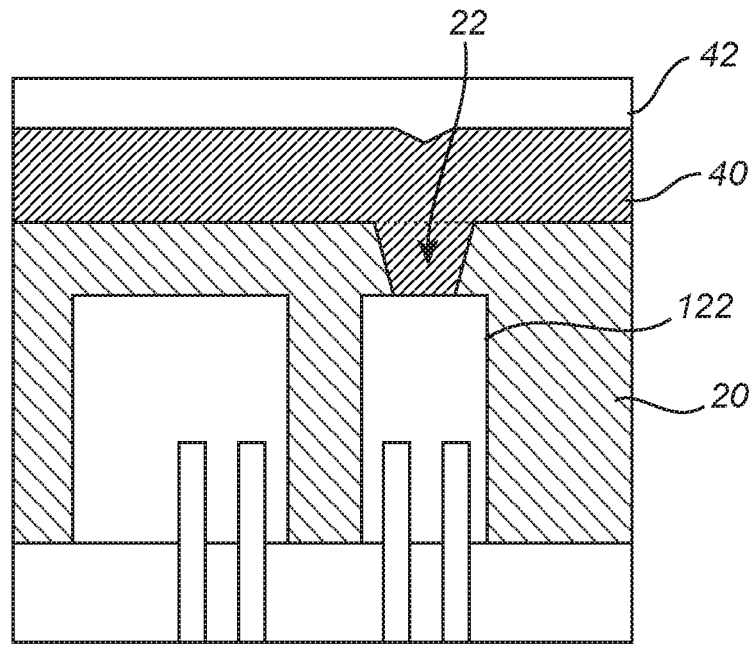
A - A          *Fig. 6A*
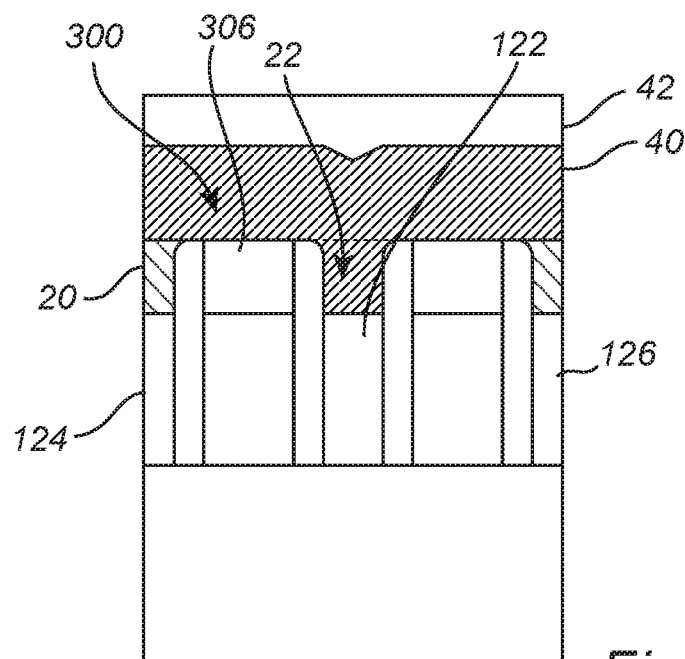
C - C          *Fig. 6B*

A-A

STANDARD CELL DEVICE AND METHOD OF FORMING AN INTERCONNECT STRUCTURE FOR A STANDARD CELL DEVICE

CROSS-REFERENCE TO RELATED APPLICATIONS

This application claims foreign priority to European Patent Application No. 19168362.2, filed Apr. 10, 2019, the contents of which are incorporated by reference herein in its entirety.

BACKGROUND

Technological Field

The disclosed technology relates to a method of forming an interconnect structure for a standard cell semiconductor device. The disclosed technology further relates to a standard cell semiconductor device.

Description of the Related Technology

Modern semiconductor device processing involves designing integrated circuits including a great number of standardized unit cells ("standard cells") including a combination of active devices, such as transistors. Intra- and inter-cell signal routing between active devices may be provided by an interconnect structure including, for example, a set of metal lines and vias. Standard cells may be designed to provide certain functionality, logic functions, storage functions or the like. In standard cell methodology, the designer may accordingly combine cells from a library of standard cells to design a circuit with desired functions.

The metal lines of an interconnect structure for a standard cell may be formed along a respective one of a set of "routing tracks" extending in parallel in a first cell direction and being spaced apart in a second cell direction transverse to the first cell direction.

As integrated circuits continue to become smaller and smaller and simultaneously include an increasing number of semiconductor devices within a given area, there is a strive for reducing the size of the standard cells, among others by reducing the "track height" of the cell, i.e. the number of routing tracks per cell. One example of a "low track height" includes a center track, a pair of off-center tracks located on opposite sides of the center track, and a pair of edge tracks located on opposite sides of the pair of off-center tracks. The pair of edge tracks may be shared with neighboring cells. As an example, metal lines for signal routing may be formed along the center track and the pair of off-center tracks, while power rails may be formed along the edge tracks. Defining the tracks with a uniform line width and pitch enables forming of a 4 track height cell.

Meanwhile, the trend towards ever more aggressive track/metal line pitch makes it increasingly challenging to fabricate the interconnect structures. Extreme ultraviolet lithography (EUVL), although being a promising technology, is not yet mature enough to enable reliable direct printing of tight pitch metal line patterns for low track height cells (for example, 20-40 nm pitch or lower). Meanwhile, state of the art multiple-patterning techniques such as self-aligned double or quadruple patterning (SADP, SAQP) are limited by processing inaccuracies such as etch placement errors (EPE), overlay variations and critical dimension (CD) variations, which may limit the possibility to continue the scaling.

SUMMARY OF CERTAIN INVENTIVE ASPECTS

An objective of at least some aspects of the disclosed technology is to address this challenge and provide a method for forming an interconnect structure for a standard cell semiconductor device avoiding or mitigating at least some of the process variations existing in conventional approaches. Further and alternative objectives may be understood from the following.

According to an aspect of the disclosed technology, there is provided a method for forming an interconnect structure for a standard cell semiconductor device, the method including: forming metal lines above active regions of a cell, the metal lines extending along respective routing tracks, the routing tracks extending in parallel in a first cell direction and being spaced apart in a second cell direction, transverse to the first cell direction, the routing tracks including: a center track, a first and a second off-center track on mutually opposite sides of the center track at a first distance from the center track, and a first and a second edge track on mutually opposite sides of the center track at a second distance from the center track, greater than the first distance, wherein forming the metal lines includes: depositing, on a first dielectric layer covering the active regions of the cell, a metal layer and a capping layer on the metal layer, patterning the capping layer and the metal layer to form a first capped off-center metal line extending along the first off-center track and a second capped off-center metal line extending along the second off-center track, forming spacer lines on sidewalls of the capped off-center metal lines, thereby forming first and second spacer-provided capped off-center metal lines, embedding the spacer-provided capped off-center metal lines in a second dielectric layer, patterning a set of trenches in the second dielectric layer by etching the second dielectric layer selectively with respect to the capping layer and the spacer lines of the spacer-provided capped off-center metal lines, the set of trenches including: a center trench extending along the center track between the spacer-provided capped off-center lines, and a first and a second edge trench extending along the first and second edge tracks, respectively, on mutually opposite outer sides of the spacer-provided capped off-center metal lines, and forming a center metal line in the center trench, and a first and a second edge metal line in the first and second edge trenches, respectively.

The disclosed technology provides a processing scheme enabling forming of metal lines of an interconnect structure with tight pitch metal lines. The method involves a sequential/non-uniform approach for forming the metal lines of the cell. That is, the off-center metal lines are directly printed in a deposited conductive layer. The center metal line and edge metal lines are subsequently formed in trenches etched adjacent to and along-side the off-center metal lines. This approach makes the method highly compatible with conventional SAQP schemes. Indeed, the spacer-provided capped off-center metal lines function as spacer-provided "mandrels/cores" during the trench etching. Unconventionally though, these mandrels may remain to form metal lines of the interconnection layer.

During the trench pattering, the (insulating) spacer lines formed on the off-center metal lines ensures a well-defined and minimum horizontal electrical separation from the off-center metal lines, due to the selective etching of the dielectric layer with respect to the spacer lines.

The term "selective etching" of a feature "A" with respect to a feature "B" may hereby be used to refer to a feature A, arranged adjacent to a feature B, being etched while preserving the feature B. Depending on a relative etch rate of the feature A and feature B, the preservation of the feature B following the etch process may be complete (in the sense that the feature B is not affected appreciably during the etch process) or at least partial (in the sense that the feature B remains at least to the extent that it may serve its intended function during subsequent process steps or in a final device structure). A ratio of an etch rate of the material of feature A compared to an etch rate of the material of feature B may advantageously be 2:1 or higher, but more preferably 10:1 or higher, or even more preferably 40:1 or higher.

Advantageously, the center trench may be formed to expose a first spacer line of the first spacer-provided capped off-center metal line and a first spacer line of the second spacer-provided capped off-center metal line. Thus, the sidewalls of the center trench may be defined by the first (i.e. inner) spacer lines of the first and second spacer-provided capped off-center metal lines. Accordingly, the first spacer line of the first spacer-provided capped off-center metal line may form an insulating interfacial line between the center metal line and the metal line of the first spacer-provided capped off-center metal line. Correspondingly, the first spacer line of the second spacer-provided capped off-center metal line may form an insulating interfacial line between the center metal line and the metal line of the second spacer-provided capped off-center metal line.

Correspondingly, the first edge trench may be formed to expose a second spacer line of the first spacer-provided capped off-center metal line and the second edge trench exposes a second spacer line of the second spacer-provided capped off-center metal line. Accordingly, the inner sidewalls of the edge trenches may be defined by the second (i.e. outer) spacer lines of the first and second spacer-provided capped off-center metal lines. Accordingly, the second spacer line of the first spacer-provided capped off-center metal line may form an insulating interfacial line between the first edge metal line and the metal line of the first spacer-provided capped off-center metal line. Correspondingly, the second spacer line of the second spacer-provided capped off-center metal line may form an insulating interfacial line between the second edge metal line and the metal line of the second spacer-provided capped off-center metal line.

As may be understood by the skilled person, "routing tracks" of a cell may refer to horizontally extending geometrical tracks or geometrical lanes defining positions of metal lines in relation to the layout of the cell. A horizontal extension or direction may refer to an extension or direction parallel to a horizontal plane defined by a main surface/main plane of extension of a substrate of the standard cell device.

The center track of the cell may hence denote a geometrical track at a horizontal central position/mid-position with respect to the cell. The off-center tracks of the cell may denote geometrical tracks located on mutually opposite sides of the center track, with a first spacing from the center track. The edge tracks of the cell may denote geometrical tracks located on mutually opposite sides of the center track, with a second spacing from the center track which is greater than the first spacing. More specifically, the edge tracks may extend along and touch or overlap the edges/boundaries of the cell.

Generally, unless stated otherwise, a feature (for example, a line) extending along a given track may be understood as the feature (for example, the line) extending along and coinciding with the track.

A first feature (such as a layer, a line, a mask or other structure) being formed "above" (or "below") a second feature (such as a layer, a line, a mask or other structure), may as used herein be understood as the first feature being formed above (or below) the second feature as seen in a vertical direction perpendicular to the horizontal plane, i.e. normal to the main surface of the substrate.

A first feature (such as a layer, a line, a mask or other structure), formed "on" or in contact with a second feature (such as a layer, a line, a mask or other structure) may either be formed directly on or in contact with the second feature (i.e. in direct physical contact/abutment with the second feature), or indirectly on the second feature, with one or more structures intermediate the first and the second feature (i.e. not in direct contact with the first feature).

As used herein, a standard cell semiconductor device refers to a semiconductor device including a plurality of unit cells or functional cells. Each cell may be configured to provide a certain functionality. Example types of cells include logic cells and memory cells, such as those typically found in standard cell libraries, including for instance NAND, NOR, D-flip flop.

As may be understood from the following disclosure, the method is applicable for forming metal lines along center, off-center and edge routing tracks of standard cells of various designs.

According to some embodiments, the cell may include a first and a second active region extending in parallel in the first cell direction, the first and second active regions being formed along the first and the second off-center track, respectively. The cell may further include: a first set of contacts formed on source/drain regions of the first active region along the first off-center track, a second set of contacts formed on source/drain regions of the second active region along the second off-center track, and a set of parallel gate structures extending in the second cell direction and across channel regions of the first and second active semiconductor regions, wherein the first dielectric layer is formed to embed the sets of contacts and gate structures.

Such a cell design may advantageously be used for implementing 4-4.5 track standard cells. For instance, the relative positions of the off-center tracks and the first and second active regions may allow defining off-center metal lines connected/tapped to selected source/drain contacts. The relative positions of the center track and the first and second active regions may allow defining a central metal line for intra-cell signal routing, for example between the first and second active regions. The relative positions of the edge tracks and the first and second active regions may allow defining edge metal lines for power rails, which may be shared between neighboring cells.

The method may further include: prior to depositing the metal layer and the capping layer, forming along the first off-center track at least one via opening in the first dielectric layer, the via opening exposing a (first) contact of the first set of contacts, subsequently depositing the metal layer on the first dielectric layer, wherein the metal layer fills the via opening to form a first metal via in the via opening, and patterning the metal layer and the capping layer such that the first capped off-center metal line is connected to the contact of the first set of contacts by the first metal via. Thereby, the first off-center metal line may be electrically connected to the (first) source/drain contact, or to one or more selected source/drain contacts of the first set of source/drain contacts (if one or more via openings are formed).

In some embodiments, the first set of contacts may include an outwardly protruding contact protruding (horizontally) from the first off-center track into the first edge track and the second set of contacts may include an outwardly protruding contact protruding (horizontally) from the second off-center track into the second edge track. The first and second edge metal lines may be formed in electrical contact with the outwardly protruding contact of the first and second sets of contacts, respectively. The outwardly protruding source/drain contact design enables convenient connection of the active regions to the edge metal lines, despite their offset position "horizontally outside" of first and second active regions.

Advantageously, forming the first and second edge trenches may include: forming a trench mask (defining respective horizontal dimensions of the first and second edge trenches) on an upper surface of the second dielectric layer and etching dielectric material exposed by the trench mask until the first edge trench exposes an upper surface portion of the outwardly protruding contact of the first set of contacts and the second edge trench exposes an upper surface portion of the outwardly protruding contact of the second set of contacts, respectively. Thereby, the first edge metal line may be formed in the first edge trench in direct electrical and physical contact with the upper surface portion of the protruding contact of the first set of contacts. The second edge metal line may be formed in the second edge trench in direct electrical and physical contact with the upper surface portion of the contact of the second set of contacts. This approach of "deep etching" the edge trenches may obviate the need for a separate via formation step preceding the trench formation. The upper surface of the second dielectric layer may define a planar upper surface. The first and second edge trenches may extend through the second dielectric layer. If the first dielectric layer covers the first and second set of contacts, the first and second edge trenches may further extend into the first dielectric layer.

According to some embodiments the first set of contacts may include an inwardly protruding contact protruding from the first off-center track into the center track, and the second set of contacts may include an inwardly protruding contact protruding from the second off-center track into the center track. The center metal line may be formed in electrical contact with the inwardly protruding contacts. The inwardly protruding source/drain contact design enables convenient inter-connection of the first and second active regions via the center metal line. The center metal line may hence provide a "mid-track handshake" function. This may be used for instance for connecting the drains of an N-side to P-side connection for a CMOS device such as an inverter.

Advantageously, forming the center trench may include: forming a trench mask (defining horizontal dimensions of the center trench) on an upper surface of the second dielectric layer and etching dielectric material exposed by the trench mask until the center trench exposes an upper surface portion of the inwardly protruding contacts. Thereby, the center metal line may be formed in the center trench in direct electrical and physical contact with the upper surface portion of the inwardly protruding contacts of the first and second set of contacts, respectively. This approach of "deep etching" the edge trenches may obviate the need for a separate via formation step preceding the trench formation. The upper surface of the second dielectric layer may define a planar upper surface. The center trench may extend through the second dielectric layer. If the first dielectric layer covers the first and second set of contacts, the center trench may further extend into the first dielectric layer.

The first and second edge trenches and the center trench may be formed simultaneously: that is, by forming a trench mask defining the first and second edge trenches and the center trench and simultaneously forming the edge and center trenches by etching dielectric material exposed by the trench mask.

Each gate structure of the set of gate structures may include a gate, a gate cap and a gate sidewall spacer. The gate sidewall spacer may be formed on mutually opposite sidewalls of the gate. The gate cap may be formed on an upper surface of the gate.

The gate cap and the gate sidewall spacer may be formed of materials different from the first and second dielectric layers. Advantageously, also the gate cap and the gate sidewall spacer may be formed of different materials. This may provide etch contrast for the various etching steps of the method.

According to some embodiments, the first dielectric layer is formed with an upper surface flush with an upper surface of the gate caps, and wherein the metal layer is deposited on the upper surface of the first dielectric layer and the upper surface of the gate caps. A vertical separation between the off-center lines and the gate structures may thus be minimized. This may reduce the vertical space requirement for the interconnect structure.

It should be noted that although both off-center lines may be used to facilitate formation of the center and edge trenches, it is possible to remove at least portions of the first and/or second off-center metal line, for instance to create space for vias for contacting the first and/or second set of source/drain contacts and/or the gates. Accordingly, with respect to the second (or first) off-center metal line, the method may further include: opening a capping layer line of the second (first) spacer-provided capped off-center metal line to expose at least a portion of a metal line of the second (first) spacer-provided capped off-center metal line, and removing the at least a portion of the metal line and replacing the removed at least a portion with an insulating material.

The capping layer line may advantageously be opened by etching the capping layer line selectively with respect to the spacer lines. The (partial) removal of the first and/or second off-center metal lines may advantageously be performed after forming the center and edge metal lines.

According to a second aspect there is provided a standard cell semiconductor device including: a substrate, at least one cell including active semiconductor regions formed on the substrate, an interconnect structure arranged above the active regions of the cell and including material lines extending along respective routing tracks, the routing tracks extending in parallel in a first cell direction and being spaced apart in a second cell direction, transverse to the first cell direction, wherein the material lines include: a center metal line extending along a center track of the cell, a first off-center metal line extending along a first off-center track of a pair of off-center tracks located on mutually opposite sides of the center track at a first distance therefrom, and a second off-center metal or dummy line, the second off-center line extending along a second off-center track of the pair of off-center tracks, a first and a second edge metal line extending along a first and a second edge track, respectively, located on mutually opposite sides of the center track at a second distance therefrom, greater than the first distance, the device further including: spacer lines formed on sidewalls of the first and second off-center lines, wherein the center metal line is formed between and in contact with a first spacer line formed on an inner sidewall of the first off-center line and a first spacer line formed on an inner sidewall of the second off-center line, wherein the first edge metal line is formed along and in contact with a second spacer line formed on an outer sidewall of the first off-center line, and the second edge metal line is formed along and in contact with a second spacer line formed on an outer sidewall of the second off-center line.

This aspect provides a layout of an interconnection structure with center, off-center and edge tracks, which allows tight metal line pitch implementations. The above discussion of advantages, details and variations of the first aspect are generally applicable also to second aspect, wherefore reference is made to the above.

Accordingly, the active regions of the cell may include a first and a second active region extending in parallel in the first cell direction, the first and second active regions being formed along the first and the second off-center track, respectively. The cell may further include: a first set of contacts formed on source/drain regions of the first active region along the first off-center track, a second set of contacts formed on source/drain regions of the second active region along the second off-center track, and a set of parallel gate structures extending in the second cell direction and across channel regions of the first and second active semiconductor regions, and a dielectric layer, wherein the sets of contacts and gate structures and the material lines are arranged in the dielectric layer.

The device may further include a first metal via connecting the first off-center metal line to a contact of the first set of contacts and extending vertically therebetween.

The first set of contacts may include an outwardly protruding contact protruding from the first off-center track into the first edge track and the second set of contacts may include an outwardly protruding contact protruding from the second off-center track into the second edge track. The first and second edge metal lines may be electrically connected to the outwardly protruding contact of the first and second sets of contacts, respectively.

The first and second edge metal lines may advantageously be formed in direct electrical and physical contact with an upper surface of the outwardly protruding contact of the first and second sets of contacts, respectively.

The first and second edge metal lines may be formed in a first and a second edge trench, respectively, extending along the first and second edge tracks, respectively. The first edge trench may include a bottom surface including a dielectric bottom surface portion defined by the dielectric layer and a conductive bottom surface portion defined by an upper surface of the outwardly protruding contact of the first set of contacts, wherein the dielectric bottom surface portion is arranged at a level at or below a level of the conductive bottom surface portion. The second edge trench may include a bottom surface including a dielectric bottom surface portion defined by the dielectric layer and a conductive bottom surface portion defined by an upper surface of the outwardly protruding contact of the second set of contacts, wherein the dielectric bottom surface portion is arranged at a level at or below a level of the conductive bottom surface portion.

The first set of contacts may include an inwardly protruding contact protruding from the first off-center track into the center track and the second set of contacts may include an inwardly protruding contact protruding from the second off-center track into the center track. The center metal line may be electrically connected to the inwardly protruding contacts.

The center metal line may advantageously be formed in direct electrical and physical contact with an upper surface of the inwardly protruding contact of the first and second sets of contacts, respectively.

The center metal line may be formed in a center trench extending along the center track. The center trench may include a bottom surface including a dielectric bottom surface portion defined by the dielectric layer and a conductive bottom surface portion defined by an upper surface portion of the inwardly protruding contacts.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

FIGS. 1-14 illustrates a method for forming a standard cell semiconductor device.

DETAILED DESCRIPTION OF CERTAIN ILLUSTRATIVE EMBODIMENTS

Figure 1:
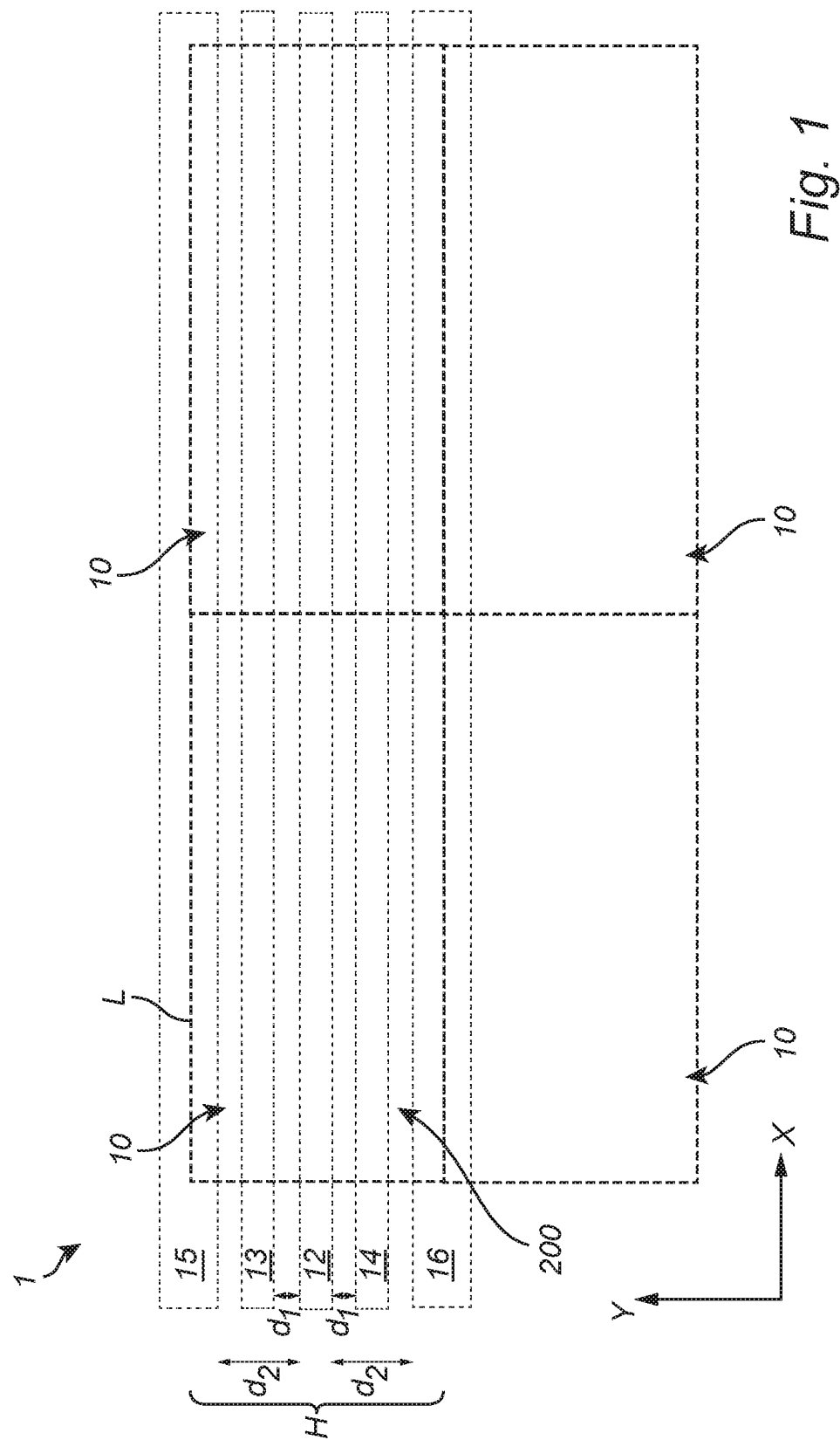

FIG. 1 is a schematic top-down view of a preliminary structure of a standard cell semiconductor device 1. The device includes a substrate 2, for instance a semiconductor substrate such as a silicon (Si) substrate, a silicon-on-insulator (SOI) substrate, a germanium (Ge) substrate, a SiGe substrate etc. The substrate 2 includes a number of cell regions 10, indicated by the dashed boundary line L, in which standard cells are to be formed. It will be appreciated that FIG. 1 only shows a small region of the substrate 2 and that the device 1 may extend horizontally outside the depicted region and accordingly include a much larger number of cell regions.

Further indicated in FIG. 1 are a number of parallel routing tracks 12-16. The routing tracks extend along the substrate 2 in a first horizontal direction which may be referred to as a first cell direction X. The routing tracks are spaced apart in a second horizontal direction which may be referred to as a second cell direction Y, transverse to the first cell direction X. The routing tracks need not per se form physical objects of the device structure, but may rather be geometrical objects defining horizontal straight-line tracks or lanes for routing metal lines which are to be formed in or above each cell 10.

The routing tracks of a cell 10 include a center track 12 located at a mid-position of the cell; first and second off-center tracks 13, 14 on mutually opposite sides of the center track 12; and first and second edge tracks 15, 16 on mutually opposite sides of the center track 12. The off-center tracks 13, 14 are each located at a first distance $d_1$ from the center track 12. The edge tracks are each located at a second distance $d_2$ from the center track 12, greater than the first distance. The edge tracks 13, 14 may as shown extend along and touch or overlap the boundaries of the cell. The depicted cells may accordingly be referred to as 4.5 track cells. By instead defining the edge tracks 15, 16 with a same line width as the center and off-center tracks 12, 13, 14, a 4 track cell may be defined.

Figure 2:
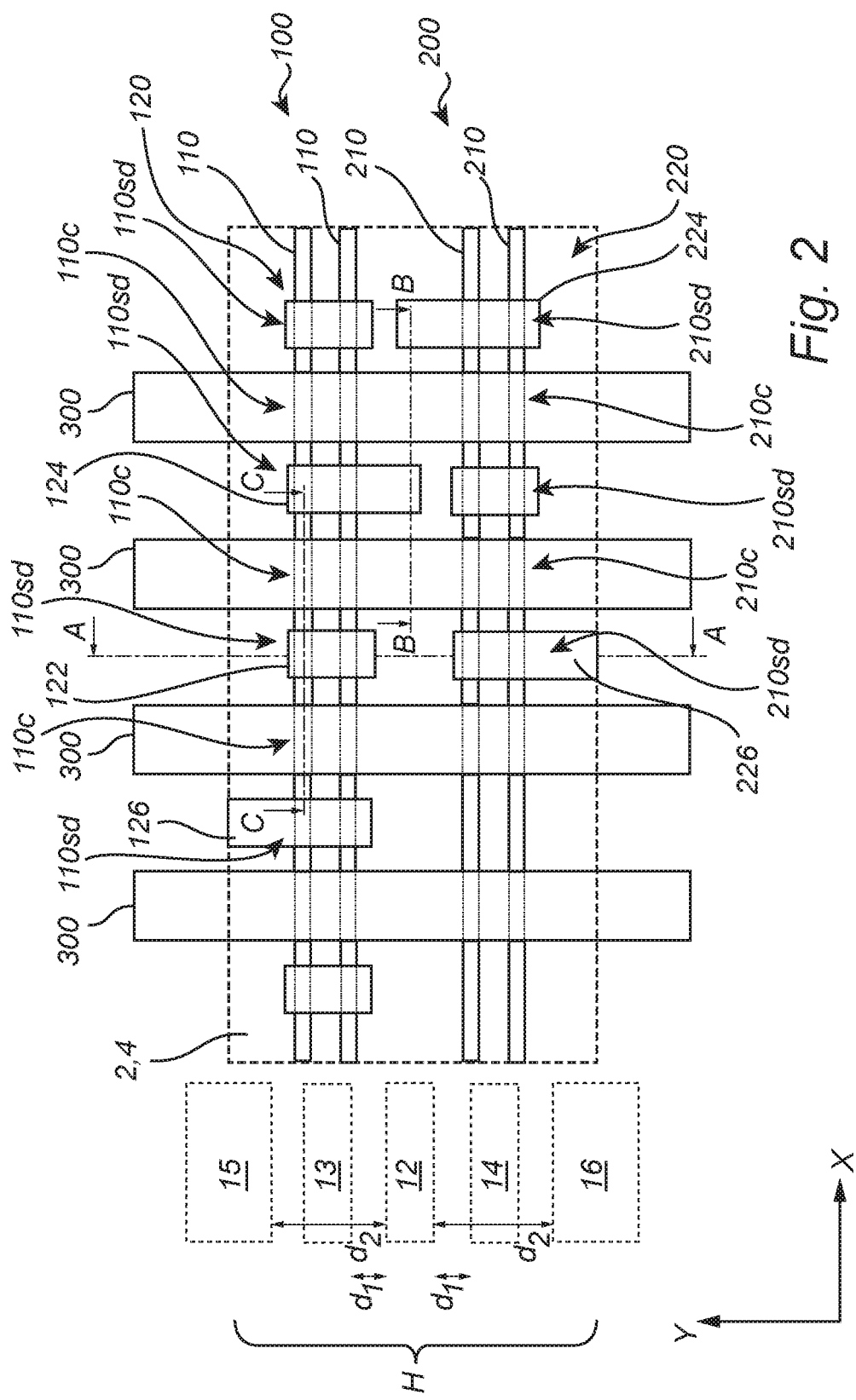
Figure 3A:
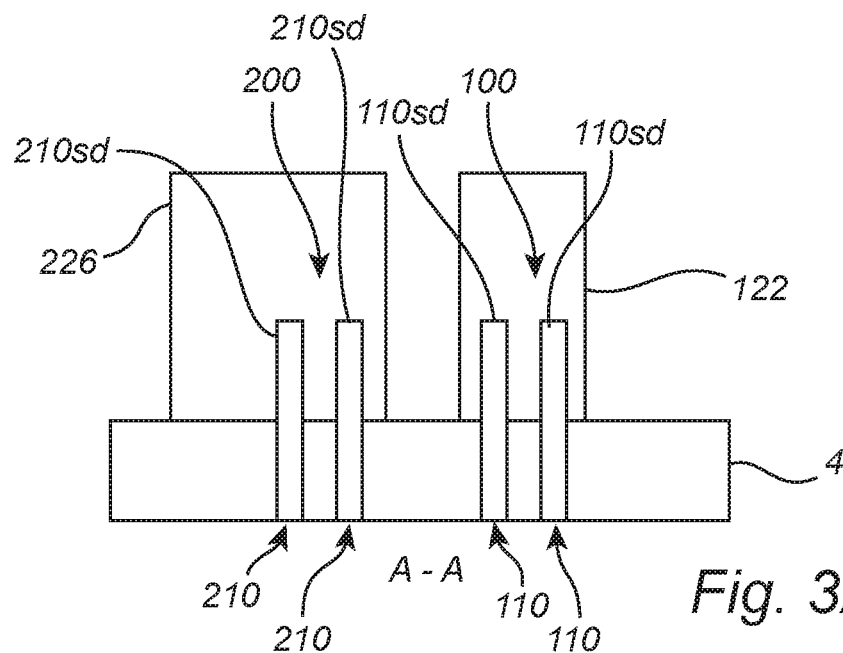
Figures 3B, 3C:
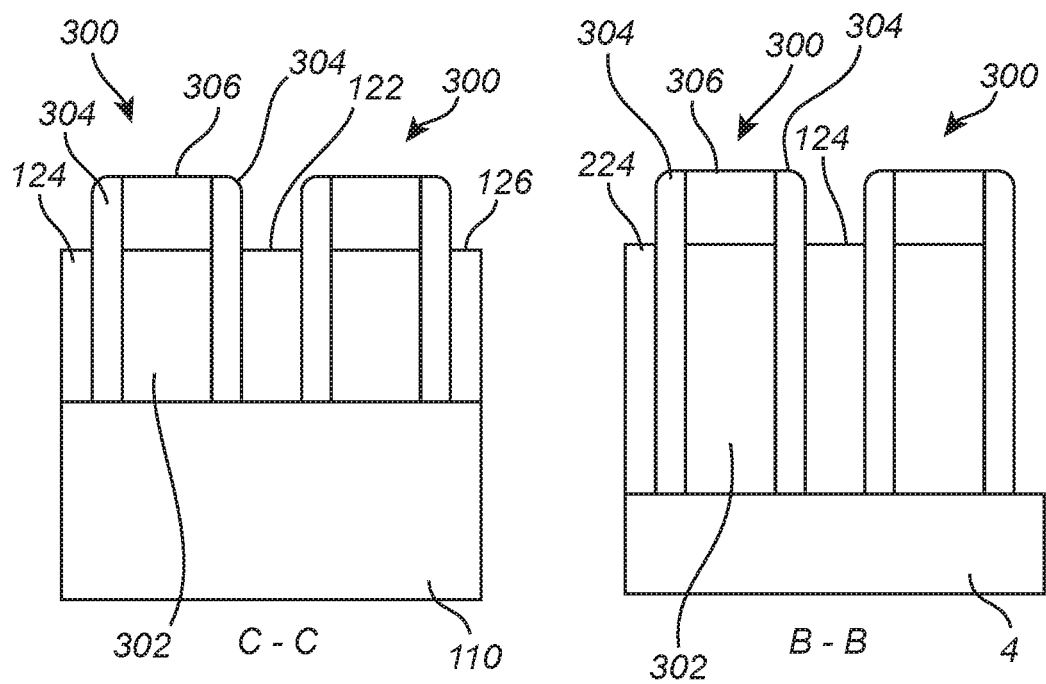

FIG. 2 is a top-down view of one cell region 10 of the cell regions shown in FIG. 1. In FIG. 2, the routing tracks 12-16 are only indicated adjacent to the cell region 10 to not obscure the cell features. FIGS. 3A, 3B, and 3C show cross-sections of the cell region 10, along the sections AA, BB and CC, respectively (but for conciseness omits the underlying substrate 2). Although reference will be made to a single cell region in the following disclosure, the following disclosure is applicable to any number of further cells 10 of the device 1.

Active regions or patterns have been formed in the cell 10 on the substrate 2. The cell 10 includes a first active region 100 extending in parallel in the first cell direction X. The first active region 100 is formed to extend along the first off-center track 13. The cell 10 includes a second active region 200 extending in parallel in the first cell direction X. The second active region 200 is formed to extend along the second off-center track 14. Put differently, the first and second off-center tracks 13, 14 are defined to extend along the first and second active regions 100, 200, respectively.

The first and second active regions 100 and 200 may be regions of complementary conductivity types. The first active region 100 may for example include a number of N- or P-type FETs and the second active region 200 may include a number of P- or N-type FETs, or vice versa.

In FIG. 2, the first and second active regions 100, 200 each include semiconductor structures in the form of a respective pair of parallel semiconductor fins 110, 210. However, other configurations are also possible such as first and second active regions including only a single semiconductor fin 110, 210 or more than two semiconductor fins 110, 210. It is also possible to provide the first and second active regions 100, 200 with one or more horizontally oriented nanowire- or nanosheet-shaped semiconductor structures. Techniques for forming such semiconductor structures from one or more epitaxial semiconductor layers are well-known in the art and will not be further elaborated upon herein.

Each one of the first and second active regions 100, 200 may include a set of semiconductor source/drain regions 110sd, 210sd, and a set of semiconductor channel regions 110c, 210c, each channel region 110c, 210c being arranged between a pair of source/drain regions 110sd, 210sd. For instance, the source/drain regions 110sd may be doped with an N-type dopant and the source/drain regions 210sd may be doped with a P-type dopant, or vice versa. The source/drain regions 110sd, 210sd may be defined in a conventional manner. For instance, although not shown in the highly schematic view of FIG. 2, the source/drain regions 110sd, 210sd may be formed by doped semiconductor bodies epitaxially grown in the respective active regions. N- or P-type impurities may be introduced in the source/drain regions using state of the art techniques such as in-situ doping, diffusion doping and/or implantation doping.

A lower portion of the semiconductor structures 110, 210 of the first and second active regions 100, 200 may be embedded in an insulating layer 4 covering the substrate 2. The insulating layer 4 may for instance be formed using a shallow trench insulation (STI) technique.

A first set of source/drain contacts 120 (hereinafter for brevity termed "first set of contacts 120") have been formed on at least a subset of the source/drain regions 110sd, along the first off-center track 13. A corresponding second set of source/drain contacts 220 (hereinafter for brevity termed "second set of contacts 220") have been formed on at least a subset of the source/drain regions 210sd, along the second off-center track 14. The contacts of the first and second set of contacts 120, 220 may be metal contacts.

The first set of contacts 120 may include an inwardly protruding contact 124 protruding from the first off-center track 13 into the center track 12 to thusly intercept the center track 12. Correspondingly, the second set of contacts 220 may include an inwardly protruding contact 224 protruding from the second off-center track 14 into the center track 12 to intercept the center track 12. As may be better understood from the following, this enables convenient inter-connection of the first and second active regions 100, 200 via a center metal line.

The first set of contacts 120 may include an outwardly protruding contact 126 protruding from the first off-center track 13 into the first edge track 15 to intercept the first edge track 15. Correspondingly, the second set of contacts 220 may include an outwardly protruding contact 226 protruding from the second off-center track 14 into the second edge track 16, to intercept the second off-center track 14. As may be better understood from the following, this enables convenient connection of the active regions 100, 200 to edge metal lines, for instance for the purpose of providing power rail connection.

It should be noted that the positions along the routing tracks and the numbers of inwardly or outwardly protruded source/drain contacts is purely exemplary and that other layouts also are possible.

A set of parallel gate structures 300 has been formed to extend in the second cell direction Y and across the channel regions 110c, 210c of the first and second active semiconductor regions 100, 200. As may be seen in FIGS. 3B and 3C, a vertical dimension/height of the gate structures may exceed a vertical dimension/height of the source/drain contacts 120, 220. It should be noted that in FIG. 2, each gate structure 300 is shown in a simplified form as a single element structure, to not overly obscure the underlying structure. However, as shown in FIGS. 3A, 3B, and 3C, each gate structure 300 may include a gate dielectric (not shown), a gate (electrode) 302, a gate cap 306 and gate sidewall spacer 304 (visible in FIGS. 3A, 3B, and 3C). Suitable gate dielectrics include conventional gate oxides and high-k dielectrics (such as $HfO_2$, $ZrO_2$, $Al_2O_3$). Suitable gate materials include one or more metals, for instance conventional p- and n-type work function metals (such as TiN, TaN, TiTaN or Al, TiAl, TiC, TiAlC) and fill metals (such as W, Al, Co, Ni, Ru). The gate cap 306 and the gate sidewall spacer 306 may be formed of different materials. This may provide etch contrast for the various etching steps of the method. Suitable materials for the gate sidewall spacer 304 and the gate cap 306 include oxide- and nitride-based materials such as SiCO for the gate sidewall spacer 304 and SiN or oxide-layer for the gate cap 306.

Depending on the shape of the semiconductor structures in the active regions 100, 200 the gate structures 300 may for instance define tri-gates (e.g. in the case of fin-shaped channels) or wrap-around gates (e.g. in the case of nanowire or nanosheet-shaped channels).

The gate structures 300 may as shown extend along beyond the cell 10 and into neighboring cells. Although shown as continuous structures, it should be noted that one or more of the gate structures 300 may be interrupted inside or outside of the cell 10 by gate cuts, as is known in the art. It may further be noted that all gate structures 300 need not form electrically active gates but merely form electrically "dummy gates", as is known in the art.

The source/drain contacts 120, 220 and the gate structures 300 may be formed using respective conventional process techniques. For instance, the gate structures 300 may be formed in a gate first process or a gate last/replacement metal gate (RMG) process. The source/drain contacts 120, 220 may be formed by depositing one or more metal layers on the source/drain regions 110sd, 120sd. The metal layer(s) may be deposited in contact trenches defined above the source/drain regions in a dielectric layer. Alternatively, the metal layer(s) may be patterned by lithography and etching to define individual contacts with desired dimensions.

Figure 4A:
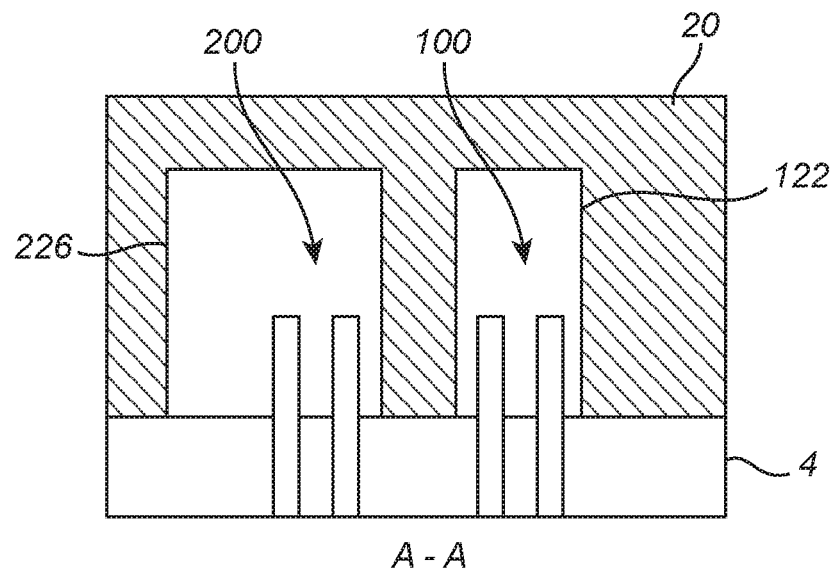
Figure 4B:
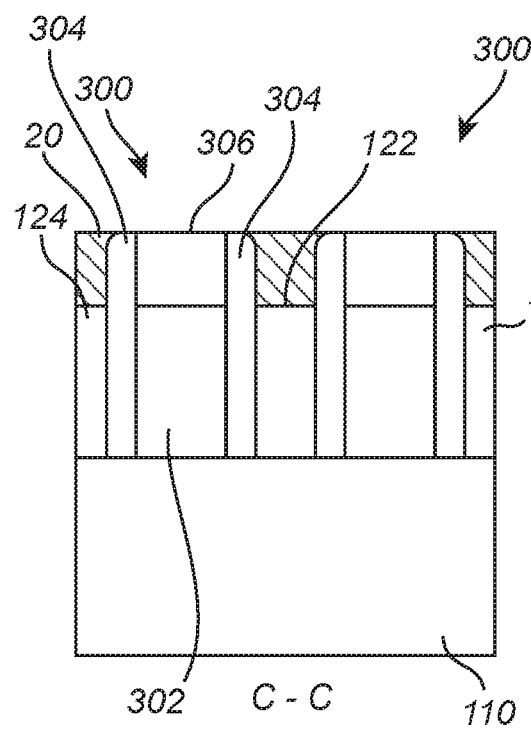
Figure 4C:
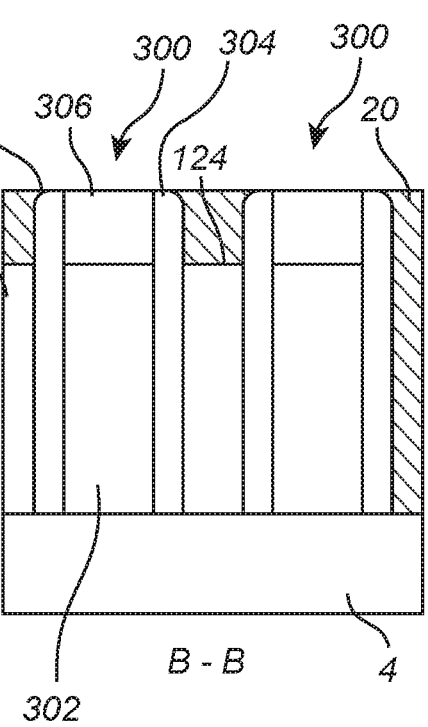

In FIGS. 4A, 4B, and 4C, a first dielectric layer 20 has been formed to cover the active regions 100, 200 and embed the sets of contacts 120, 220 and gate structures 300. The first dielectric layer 20 may, as shown, completely embed the contacts 120, 220 to cover an upper surface thereof. Meanwhile, the first dielectric layer 20 may partly embed the gate structures 300 to expose an upper surface of the gate caps 306. However, it is also conceivable to form the first dielectric layer 20 with a thickness such that also the gate structures 300 are covered. The first dielectric layer 20 may be formed on the insulating layer 4. The first dielectric layer 20 may be formed by depositing an insulating material to cover the sets of contacts 120, 220 and gate structures 300. The insulating material may for example be a layer of silicon oxide or some other low-k dielectric material, for example deposited by chemical vapor deposition (CVD). Optionally, an upper surface of the deposited insulating material may subsequently be etched back and/or polished (for example by chemical mechanical polishing, CMP) to expose the gate caps 306, and make the upper surfaces of the first dielectric layer 20 and gate caps 306 flush with each other. This may allow a subsequently deposited metal layer 40 to be deposited on the upper surface of the first dielectric layer 20 and the upper surface of the gate caps 306.

Figure 5A:
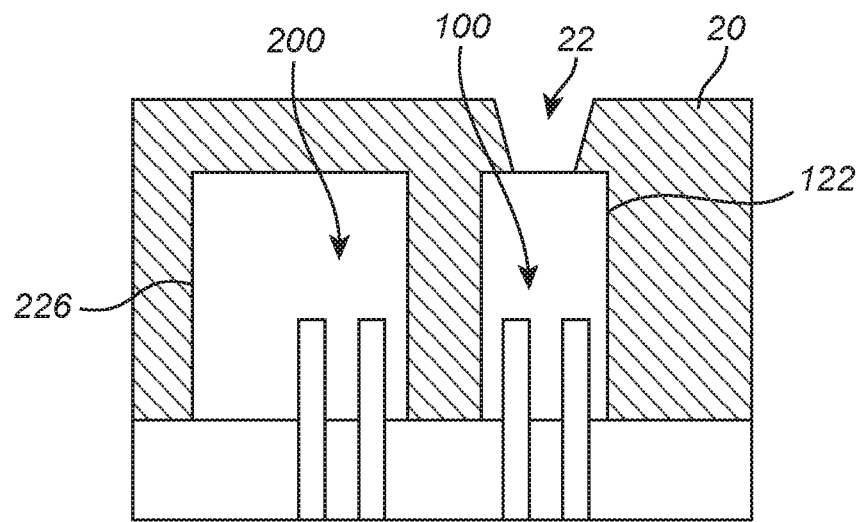
Figure 5B:
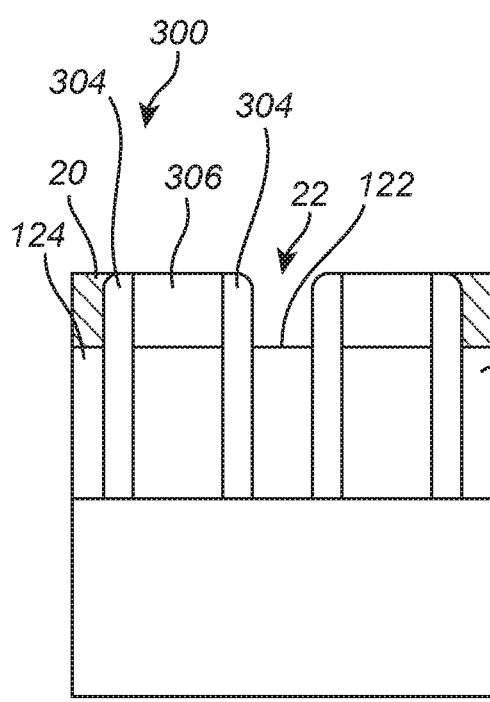
Figure 5C:
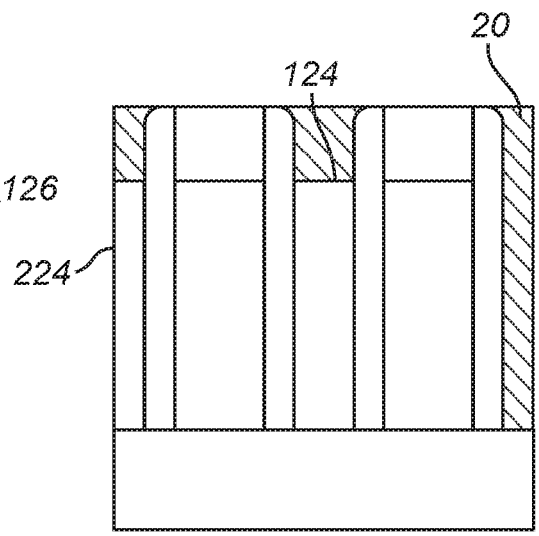

In FIGS. 5A, 5B, and 5C, at least one via opening 22 has been formed in the first dielectric layer 20, along the first off-center track 13. The via opening 22 is formed at a position above a (first) contact 122 of the first set of contacts, to expose an upper surface thereof. The via opening 22 may be defined in a litho-etch process. The via hole 22 may be etched using for instance a wet etching process or a dry etching process such as a reactive ion etch (RIE) or ion beam etch (IBE). A via mask may be formed on the first dielectric layer 20. The via mask may be a photo-resist mask or a lithographic mask layer stack (a "litho-stack") including a number of mask layers (for example one or more anti-reflective coatings, organic spin-on layers and/or transfer layers etc.) under a photo-resist layer. The via opening 22 may be formed by patterning a via opening in the via mask and thereafter transferring the opening into the first dielectric layer 20 by etching. The via mask may subsequently be removed from the first dielectric layer 20. The etching process may advantageously provide selective etching of the first dielectric layer 20 with respect to the gate caps 306 and/or gate sidewall spacers 304.

In FIGS. 6A and 6B, a metal layer 40 has been deposited on the first dielectric layer 20. The metal layer 40 may fill the via opening 22. The metal layer 40 may cover an upper surface of the dielectric layer 20 and (provided the first insulating layer 20 exposes the gate cap 306) an upper surface of the gate cap 306 of the gate structures 300. The metal layer 40 may be formed with a thickness corresponding to a desired thickness of the off-center lines 443, 444 which will be patterned in the conductive layer 40 (see FIGS. 8A and 8B). The metal layer 40 may be a single-layer or a multi-layer including a number of different sub-layers of different metals. The metal layer 40 may for instance be a CVD, PVD or ALD deposited layer of Al, Cu, W, Ru, or some other metal suitable for metal lines.

A capping layer 42 has been deposited on the metal layer 40. The capping layer may be a nitride- or oxide-layer, such as those mentioned in connection with the gate sidewall spacer 304 and the gate cap 306.

Figure 7A:
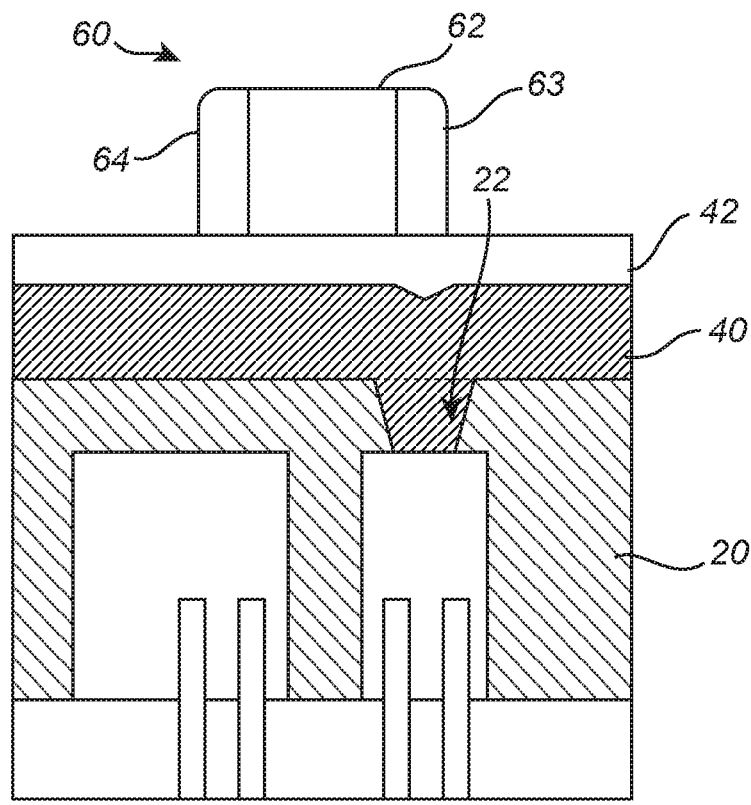
Figure 7B:
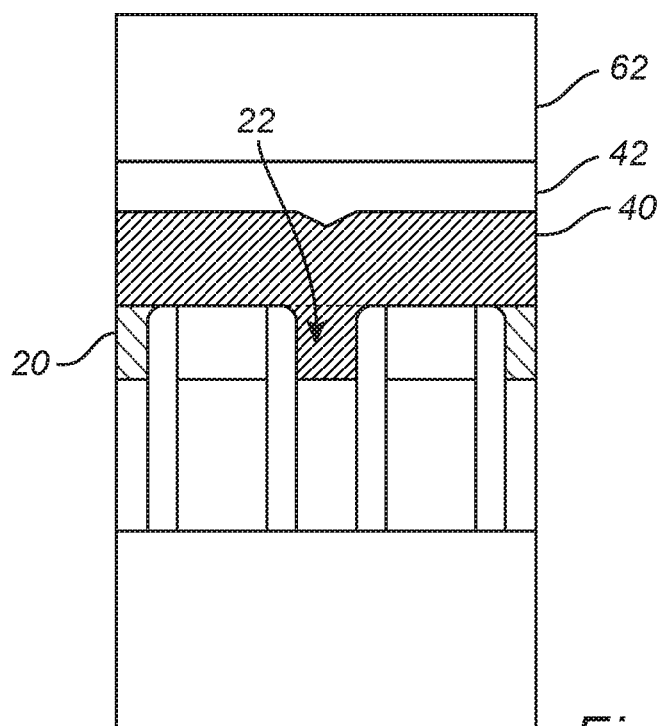

In FIGS. 7A and 7B, a mask 60 has been formed on the capping layer 42. The mask 60 includes a mandrel 62 and a pair of sidewall spacers 63, 64. The separation and width of the spacers 63, 64 define the line spacing and the line width, respectively, of the off-center lines 443, 444 which will be patterned in the conductive layer 40. Accordingly, by removing the mandrel 62 between the sidewall spacers 63, 64 the sidewall spacers 63, 64 may remain on the capping layer to define a first and a second off-center line pattern. The mask 60 may be formed using in a similar manner as a SADP or SAQP mask, i.e. generally including mandrel layer deposition, patterning of mandrel lines followed by sidewall spacer deposition on the mandrel lines. It should however be noted that it also would be possible to instead form a line mask including lithographically patterned lines at positions of the sidewall spacers 63, 63 (e.g. by EUVL).

Figure 8A:
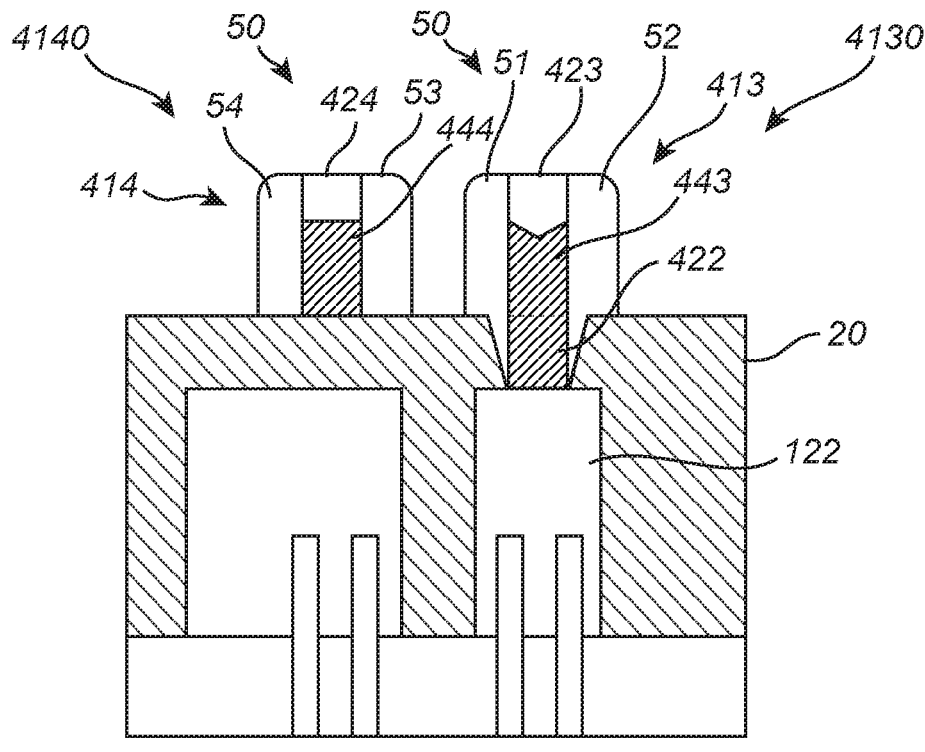
Figure 8B:
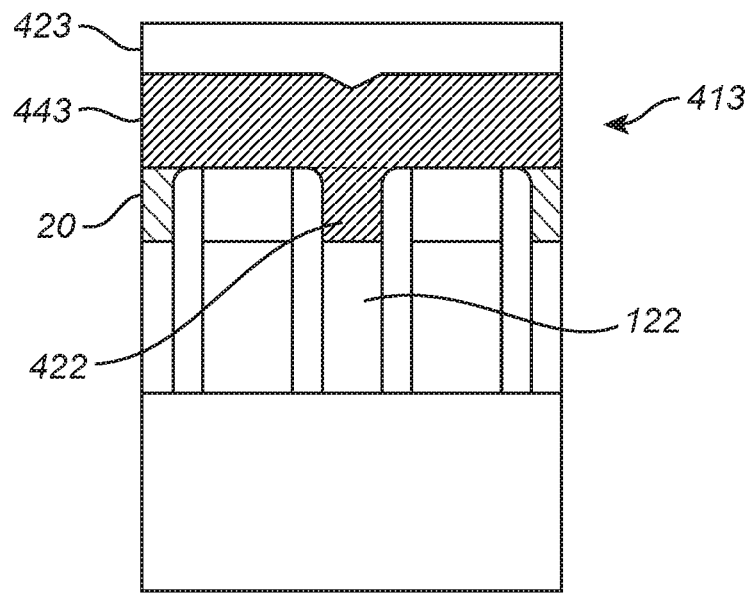

In FIGS. 8A and 8B, the metal layer 40 and the capping layer 42 have been patterned to form a first capped off-center metal line 413 extending along the first off-center track 13 and a second capped off-center metal line 414 extending along the second off-center track 14. The capping layer 42 and the metal layer 40 have been sequentially etched using the sidewall spacers 63, 64 (or corresponding line masks) as an etch mask. The remaining portions of the metal layer 40 define off-center metal lines 443, 444. The remaining portions of the capping layer 42 define capping layer lines (or shorter "cap lines") 423 and 424 on the off-center metal lines 443 and 444, respectively. The etching may include a dry etching process such as RIE using a common gas chemistry or switching gas chemistry for etching the capping layer 42 and the metal layer 40. Example etching chemistries include F-based etchants (suitable e.g. for nitride- or oxide-based materials) and Cl- and Br-based etchants (suitable for example for metals).

As may be seen in FIGS. 8A and 8B, the metal layer portion filling the via opening 22 may remain to form a (first) metal via 422. The first capped off-center metal line 413 may thus be electrically connected to the contact 122.

Subsequent to the line patterning, spacer lines 50 may be formed on sidewalls of the capped off-center metal lines 413, 414. The spacer lines 50 include a first inner spacer line 51 formed on an inwardly facing sidewall of the first capped off-center metal line 413. The spacer lines 50 include a first outer spacer line 52 formed on an outwardly facing sidewall of the first capped off-center metal line 413. The spacer lines 50 include a second inner spacer line 53 formed on an inwardly facing sidewall of the second capped off-center metal line 414. The spacer lines 50 include a second outer spacer line 54 formed on an outwardly facing sidewall of the second capped off-center metal line 414.

As shown, the off-center metal lines 443, 444 may thus be encapsulated by capping layer lines 423, 424 and the spacer lines 50. The off-center metal lines 443, 444, with the encapsulation, may be referred to as first and second spacer-provided capped off-center metal lines 4130, 4140.

The spacer lines 50 may be formed of an insulating material, i.e. to form insulating spacer lines 50. The spacer lines 50 may be formed by a nitride- or oxide-material, such as those mentioned in connection with the gate sidewall spacer 304 and the gate cap 306. The spacer lines 50 and the capping layer 42/capping layer lines 423, 424 may advantageously be formed by different materials. This may provide etch contrast during optional subsequent opening of the capping layer lines 423, 424.

The spacer lines 50 may be formed using a sidewall deposition process (for example including conformal deposition of a spacer layer followed by a vertical anisotropic etch to remove spacer layer portions from horizontally oriented surfaces such that spacer lines 50 remain on the vertically oriented sidewalls of the capped off-center metal lines).

Figure 9A:
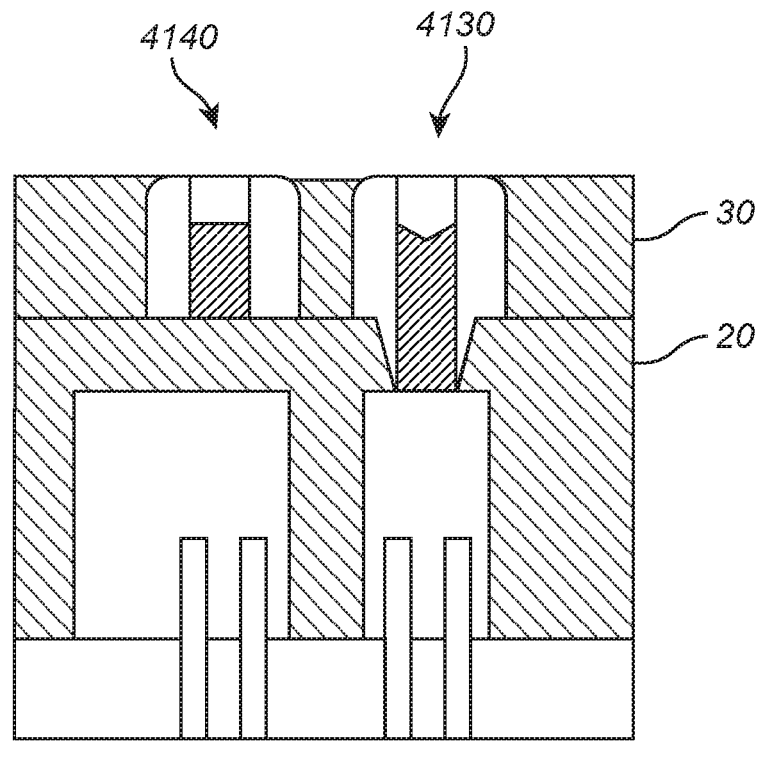
Figure 9B:
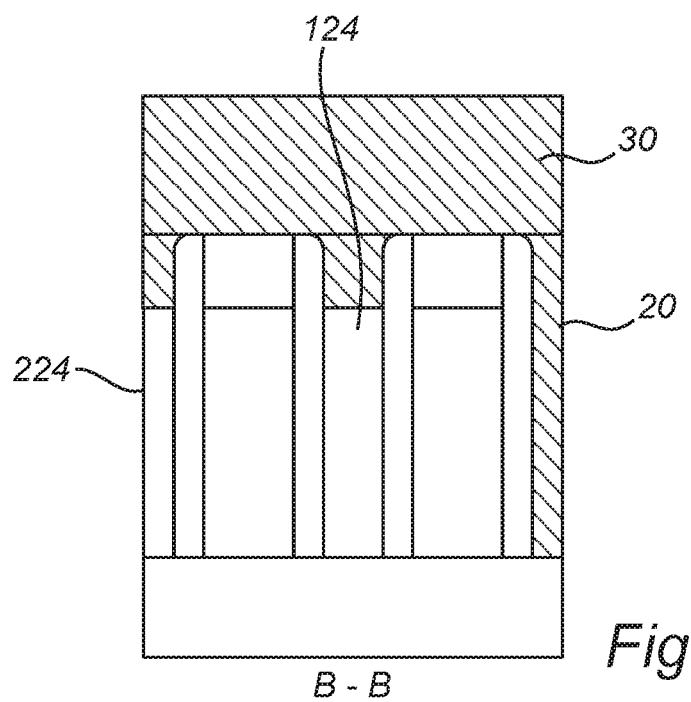

In FIGS. 9A, 9B, and 9C, the spacer-provided capped off-center metal lines 4130, 4140 have been embedded in a second dielectric layer 30. The second dielectric layer 30 may be formed in a similar manner as the first dielectric layer 20. As shown, the second dielectric layer 30 may be formed on the first dielectric layer 20. The second dielectric layer 30 may expose an upper surface of the spacer-provided capped off-center metal lines 4130, 4140. The second dielectric layer 30 may initially be deposited to cover the spacer-provided capped off-center metal lines 4130, 4140. A thickness of the initial second dielectric layer may thereafter be reduced (for example by etch-back and/or polishing) such that an upper surface thereof becomes flush with an upper surface of the spacer-provided capped off-center metal lines 4130, 4140.

Figure 10A:
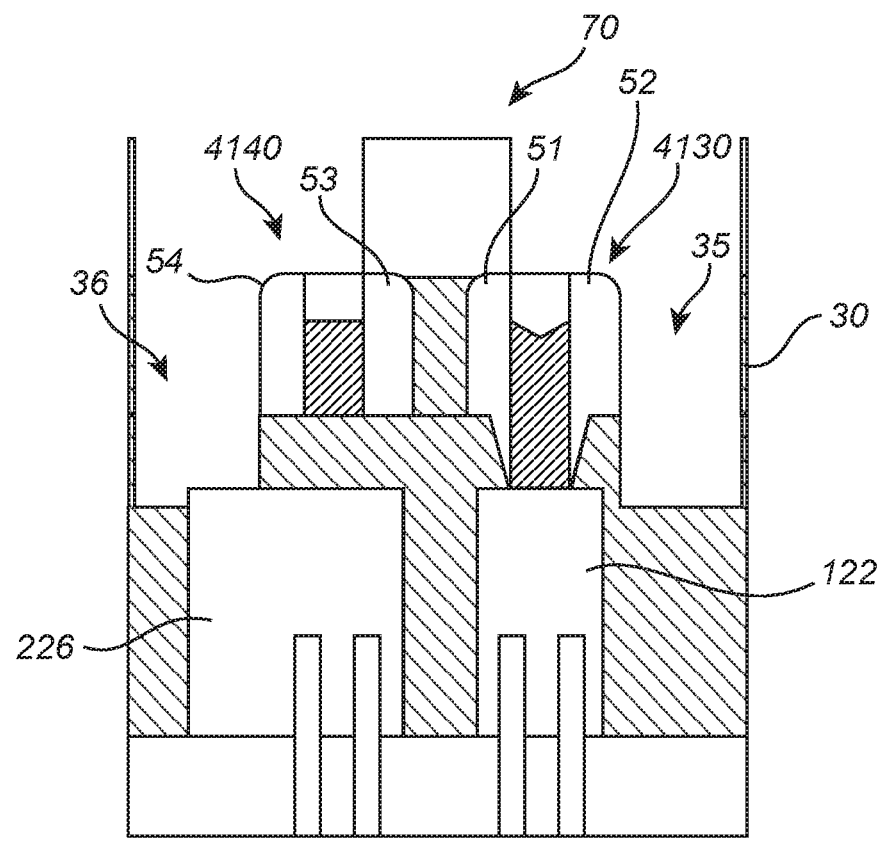
Figure 10B:
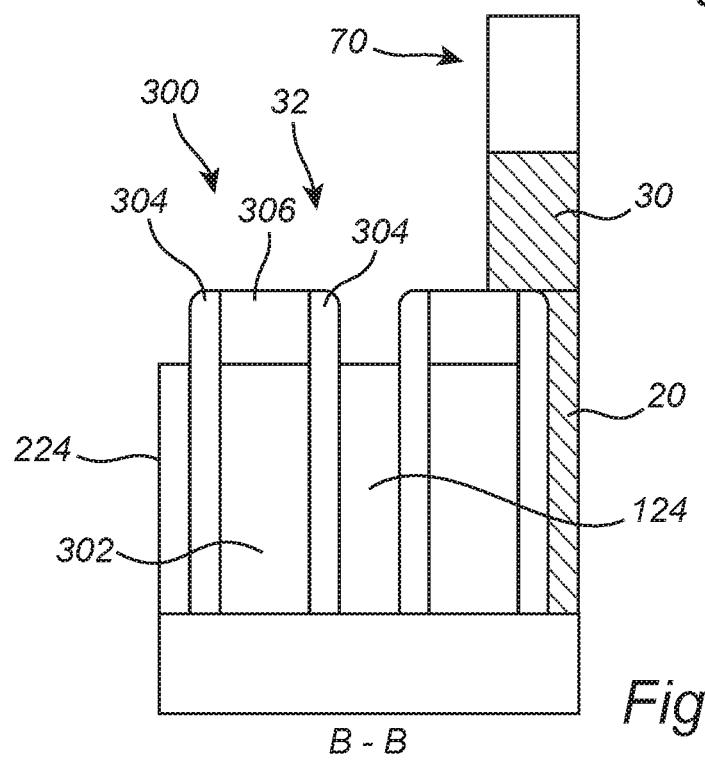

In FIGS. 10A and 10B, a set of trenches have been patterned in the second dielectric layer 30. The trenches may be formed by etching the second dielectric layer 30 selectively with respect to the capping layer lines and the spacer lines of the spacer-provided capped off-center metal lines 4130, 4140. The etching of the second dielectric layer 30 may further be selective with respect to the gate sidewall spacers 304 and gate caps 306. The trenches may as shown extend also partly into the first dielectric layer 20. The set of trenches includes a center trench 32 extending along the center track 12 between the spacer-provided capped off-center lines 4130, 4140. The set of trenches further includes a first and a second edge trench 35, 36 extending along the first and second edge tracks 15, 16, respectively, on mutually opposite outer sides of the spacer-provided capped off-center metal lines 4130, 4140.

The trench patterning may include forming a trench mask 70 above the second dielectric layer 30. The trench mask may include trench-shaped openings, exposing planar surface regions of the second dielectric layer 30. The trench mask 70 may be formed in a similar manner as the mask used for the via hole 22 (for example by a photo-resist mask or a lithographic mask layer stack) and subsequently etching the dielectric material using a wet or dry etching process. The center trench 32, and the first and second edge trenches 35, 36 may be accordingly be formed by etching back the planar upper surface regions of the second dielectric layer 30 exposed by a trench mask 70 until a desired depth has been reached. Subsequent to etching the trenches 32, 35, 36 the trench mask 70 may be removed.

As shown in FIGS. 10A and 10B, the depth of the etching may be such that the first edge trench 35 exposes an upper surface portion of the protruding contact 126 and the second edge trench 36 exposes an upper surface portion of the protruding contact 226. The center trench 32 may expose an upper surface portion of the inwardly protruding contacts 124, 224. The center and edge trenches 32, 35, 36 may accordingly be "deep-etched" and contact with source/drain contacts without any separate via formation step.

Due to the presence of the capping layer lines and the space lines on the spacer-provided capped off-center metal lines 4130, 4140, EPE when defining the trench mask 70 need not result in inadvertent exposure of the metal lines 443, 444 of the spacer-provided capped off-center metal lines 4130, 4140. Correspondingly, the gate sidewall spacers 304 and gate caps 306 enables a minimum electrical isolation between the center metal line 412 and the gate electrodes 302 (see FIGS. 11A and 11B).

Figure 11A:
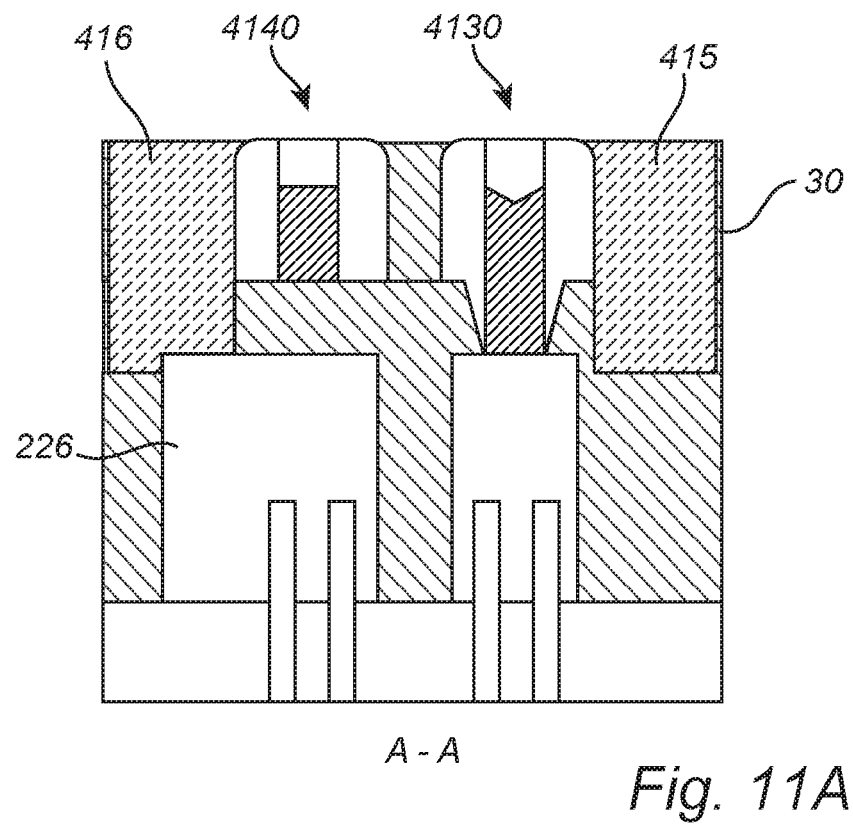
Figure 11B:
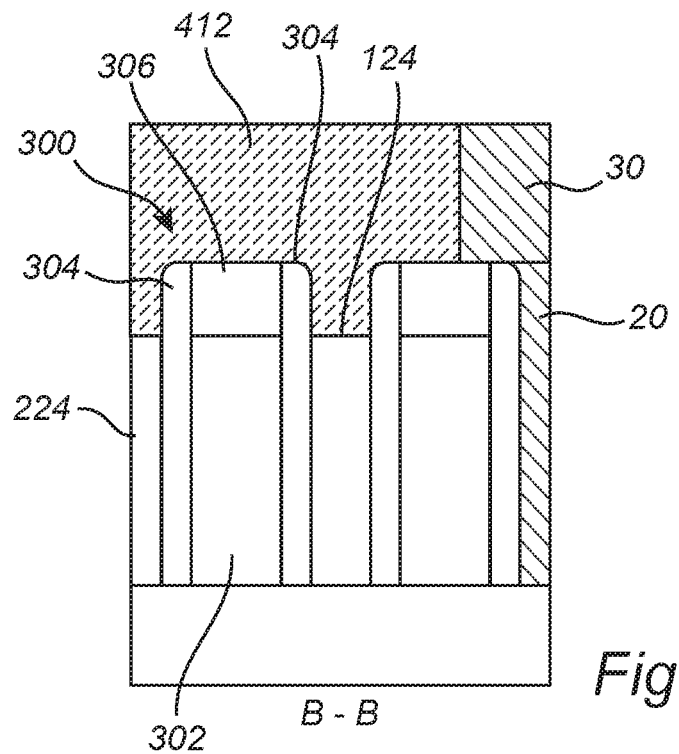

In FIGS. 11A and 11B, a center metal line 412 has been formed in the center trench 32. A first and a second edge metal line 415, 416 has been formed in the first and second edge trenches 35, 36, respectively. A metal layer may be deposited to fill the trenches 32, 35, 36. The metal layer may be a single-layer or a multi-layer including a number of different sub-layers of different metals. The material examples provided in connection with the metal layer 40 apply correspondingly to the metal layer deposited in the trenches 32, 35, 36. The metal may accordingly be deposited to cover the second dielectric layer 30 and fill the trenches 32, 35, 36. Metal layer portions deposited outside the trenches 32, 35, 36 may be removed by etch-back and/or polished, advantageously to bring the upper surfaces of the center and edge metal lines 412, 415, 416 flush with upper surfaces of the second dielectric layer 30 and the spacer-provided capped off-center metal lines 4130, 4140 (i.e. formed by the capping layer lines 423, 424).

Due to the deep etching of the center and edge trenches 32, 35, 36, the center metal line 412 may be formed in direct physical and electric connection with the inwardly protruding contacts 124, 224, while the edge metal lines 415, 416 may be may be formed in direct physical and electric connection with the outwardly protruding contacts 122, 226. As an alternative to "deep-etching" of the trenches, it is possible to form respective via openings exposing the upper surfaces of the contacts 124, 224 and 226 prior to, subsequent to, or during (i.e. in a dual damascene fashion) etching of the center and edge trenches 32, 35, 36. The metal layer may subsequently be deposited to fill the trenches 32, 35, 36 and the associated via openings to form the center and edge metal lines 412, 415, 416 connected to the respective contacts 124, 224, 122, 226.

Figure 12A:
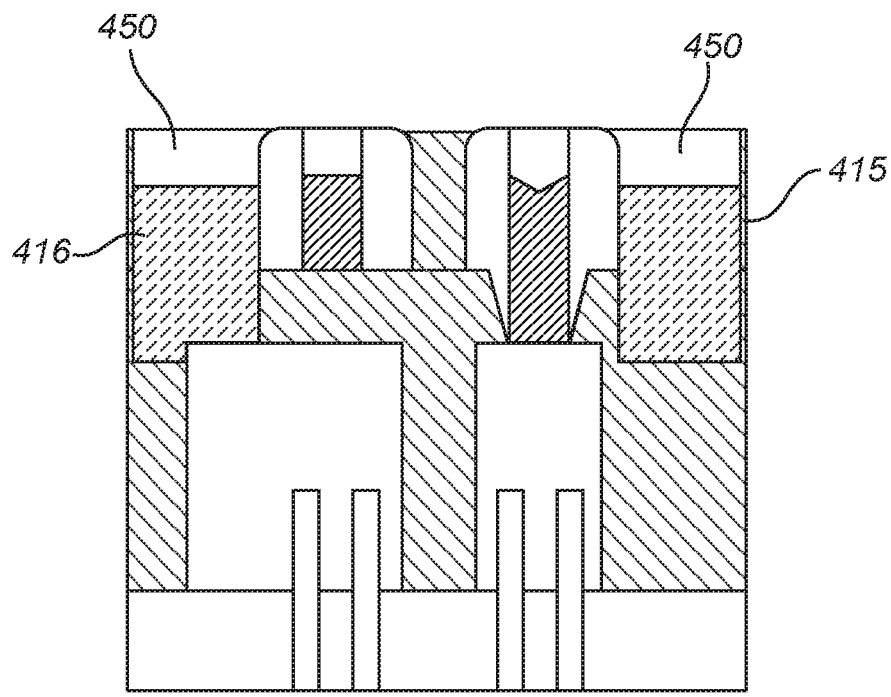
Figure 12B:
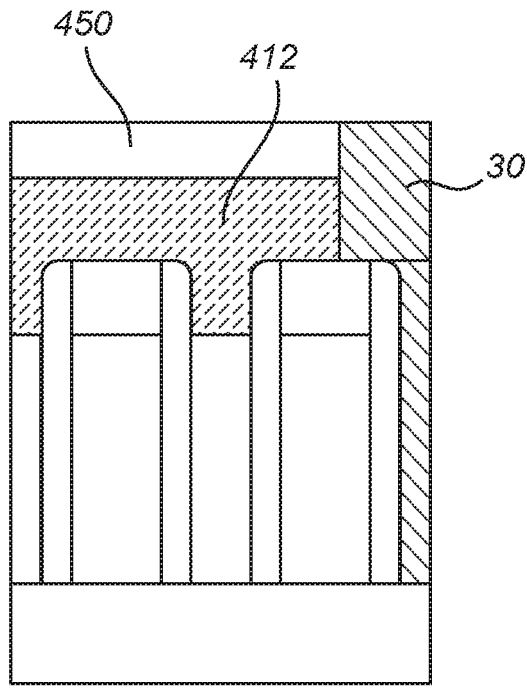

As shown in FIGS. 12A and 12B, the center and edge metal lines 412, 415, 416 may be recessed in their respective trenches 32, 35, 36. The upper surfaces of the center and edge metal lines 412, 415, 416 may thus be lowered to a level below the upper surfaces of the second dielectric layer 30 and the spacer-provided capped off-center metal lines 4130, 4140. The recessing may be achieved by etching back the upper surfaces of the center and edge metal lines 412, 415, 416, for instance using a Cl- or Br-based dry etching chemistry. Subsequent to the recessing of the center and edge metal lines 412, 415, 416, a line cap layer 450 may be deposited on each of the lines 412, 415, 416. The line cap layer 50 may be formed by any of the materials discussed in connection with the capping layer 42. The line cap layer 50 may initially be deposited to cover the recessed lines 412, 415, 416 in the trenches 32, 35, 36, the gate structures 300 and the second dielectric layer 30. Portions of the initial line cap layer 50 deposited outside of the trenches 32, 35, 36 may subsequently be removed by etch-back and/or polishing.

Figure 13:
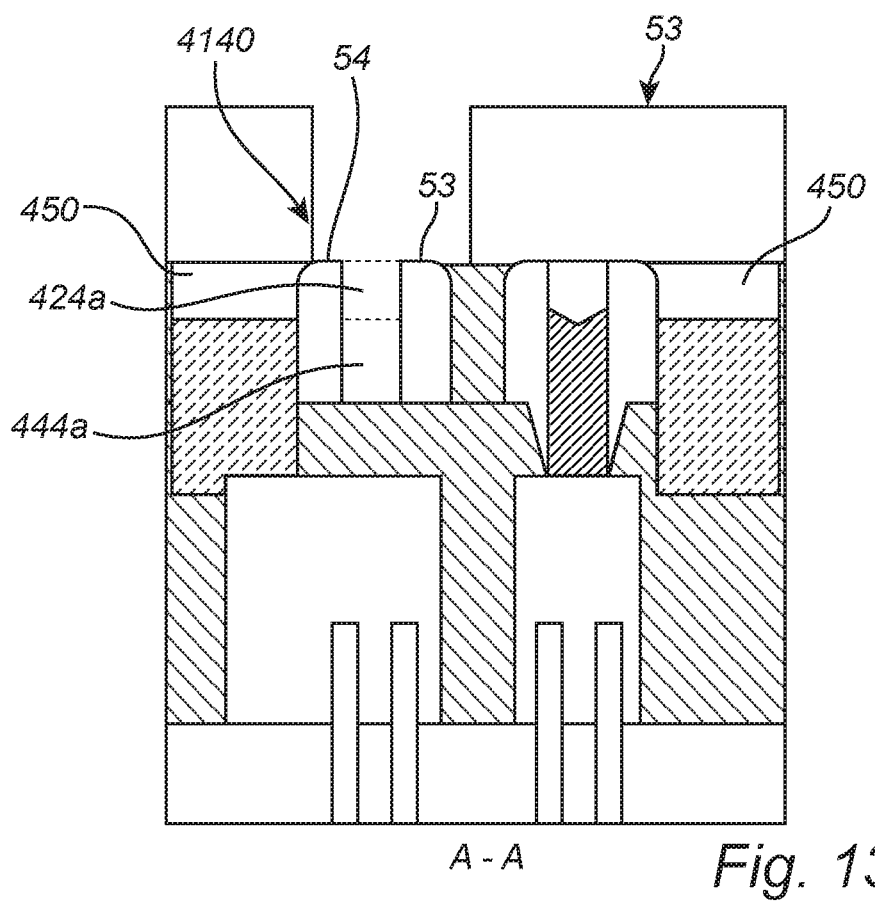
Figure 14:
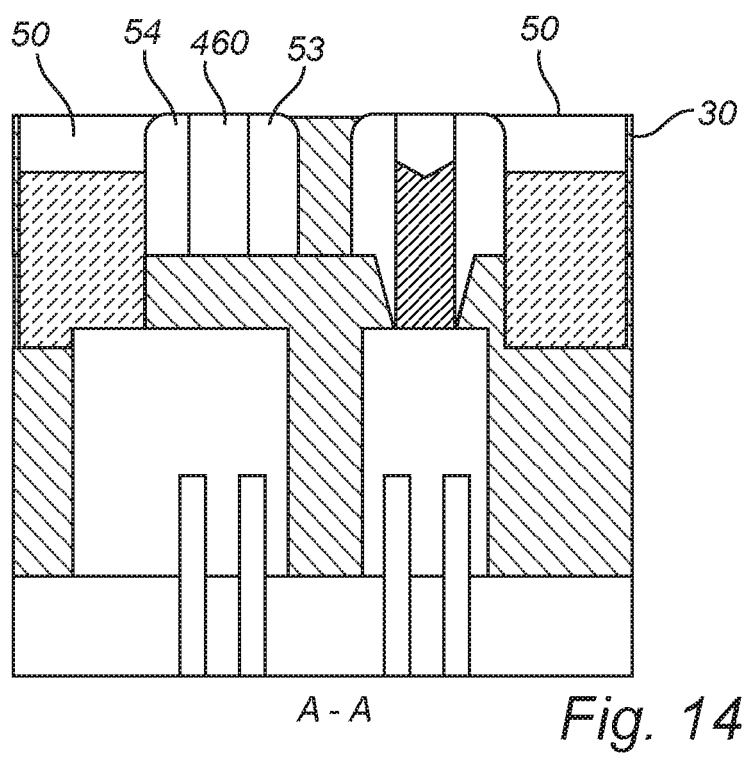

FIGS. 13 and 14 show an optional process step of removing at least a portion of the second off-center metal line 444, which correspondingly may be applied to the first off-center metal line 443. This may be performed for instance to create space for vias for contacting selected ones of the second set of contacts 220 and/or the gates 300, and/or simply to remove metal line portions which will not be used in the final device.

As shown, the capping layer line 424 of the second spacer-provided capped off-center metal line 4140 may be opened along a portion 424a to expose a desired portion of 444a of the underlying metal line 444. As indicated in FIG. 13, a line cut mask 80 may be formed above the capped off-center metal lines 4130, 4140, the mask 80 defining an opening above the capping layer portion 424a. The line cut mask 80 may be formed in a similar manner as the trench mask 70 and the mask used for the via hole 22 (for example by a photo-resist mask or a lithographic mask layer stack). The capping layer may advantageously be opened by etching the capping layer 42 selectively with respect to the spacer lines 50. Subsequent to removing the capping layer portion 424a, the metal line portion 444a may be removed. The capping layer portions 424a and the metal line portion 44a may be etched using a same type of etching process as for the patterning of the capping layer 42 and the metal layer 40. Thereafter the line cut mask 80 may be removed.

As shown in FIG. 14, the resulting space may then be filled with an insulating material, thereby defining a dummy line 460 along the second off center track 16. The insulating material may include any of the materials discussed in connection with the capping layer 42, or for example silicon oxide or some other low-k dielectric material. Portions of insulating material deposited outside of the cut region may subsequently be removed by etch-back and/or polishing such that an upper surface of the dummy line 460 becomes flush with the line cap layer 50.

Figure 15:
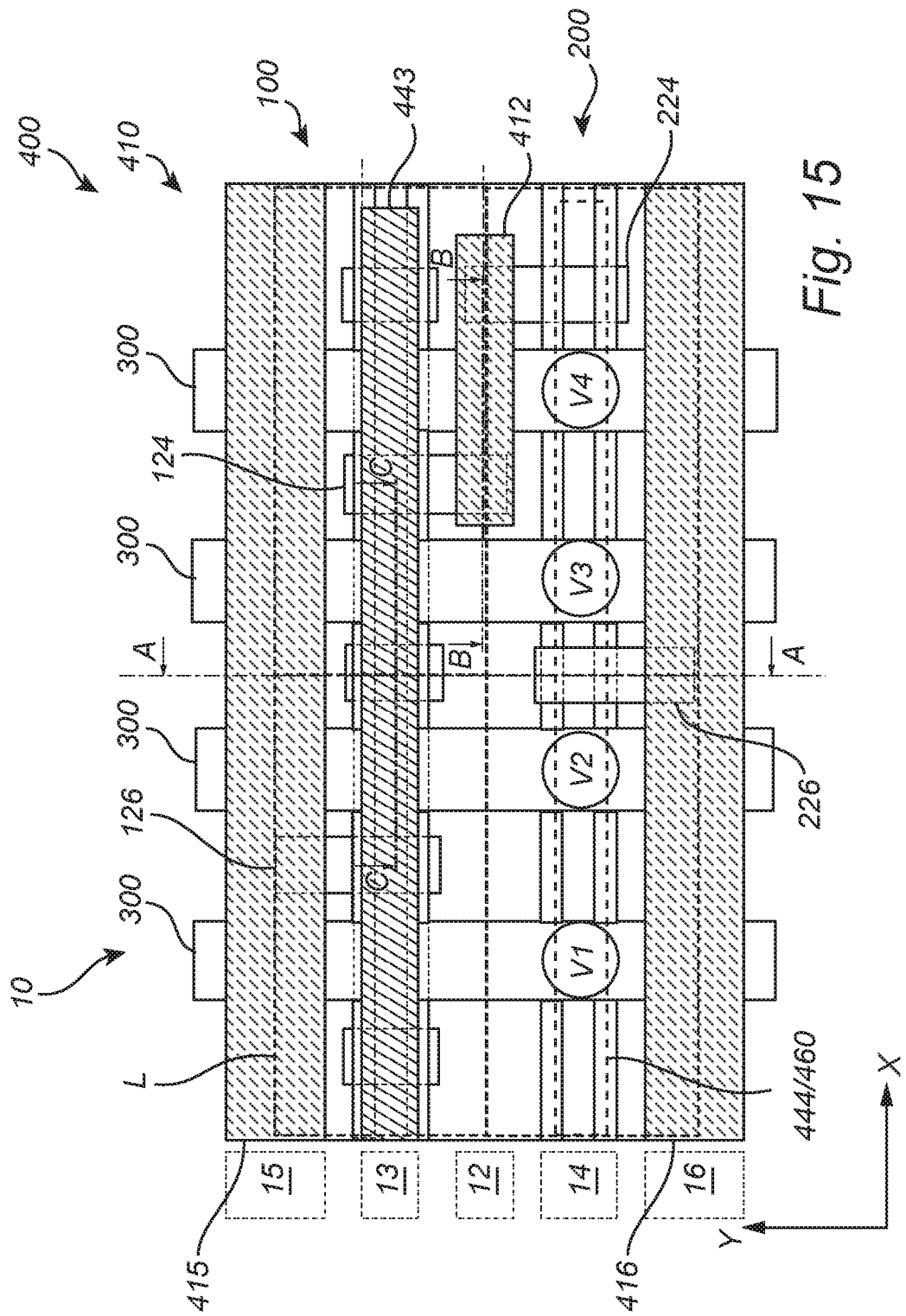
FIG. 15 shows a standard cell semiconductor device.

FIG. 15 provides a top-down view of a standard cell semiconductor device 1, which may be formed for instance using the above-described method. The device 1 includes an interconnect structure 400 arranged above the first and second active regions 100, 200 of the cell 10. The interconnect structure 400 includes material lines 410 extending along respective routing tracks. The center metal line 412 extends along the center track 12; the first off-center metal line 443 extends along the first off-center track 13; and the first and the second edge metal lines 415, 416 extend along the first and second edge tracks 15, 16, respectively. In the illustrated configuration, a second off-center line originally formed along the second off-center track 14 has been removed and replaced by a dummy line 460, as discussed above in connection with FIGS. 13 and 14 and as indicated by the dashed box in FIG. 15. Accordingly, metal vias V1 through V4 may be connected to the gate electrodes of the gate structures 300. As would be appreciated by the skilled person, the illustrated cell layout merely represents an example and other types of 4 or 4.5 track cells also are possible, for instance cell layouts including both first and second off-center metal lines.

As may be understood from the above-disclosed method, the center metal line 412 may be separated from the first off-center metal line 443 and the second off-center material line 460 (or metal line 444) as the case may be) by the inner spacer lines 51, 53, respectively (see, for example, FIGS. 10A and 11). Meanwhile, the first edge metal line 415 may be separated from the first off-center metal line 443 by the outer spacer line 52, and the second edge metal line 416 may be separated from the second off-center material 460 (or metal line 444) by the outer spacer line 54.

In the above the disclosed technology has mainly been described with reference to a limited number of examples. However, as is readily appreciated by a person skilled in the art, other examples than the ones disclosed above are equally possible within the scope of the disclosed technology and the appended claims.

What is claimed is:

1. A method of forming an interconnect structure for a standard cell semiconductor device, the method comprising:
    forming metal lines above active regions of a cell, the metal lines extending along respective routing tracks, the routing tracks extending in parallel in a first cell direction and being spaced apart in a second cell direction, transverse to the first cell direction, the routing tracks comprising: a center track, a first and a second off-center track on mutually opposite sides of the center track at a first distance from the center track, and a first and a second edge track on mutually opposite sides of the center track at a second distance from the center track, greater than the first distance, wherein forming the metal lines comprises:
        depositing, on a first dielectric layer covering the active regions of the cell, a metal layer and a capping layer on the metal layer,
        patterning the capping layer and the metal layer to form a first capped off-center metal line extending along the first off-center track and a second capped off-center metal line extending along the second off-center track,
        forming spacer lines on sidewalls of the capped off-center metal lines, thereby forming first and second spacer-provided capped off-center metal lines,
        embedding the spacer-provided capped off-center metal lines in a second dielectric layer;
    patterning a set of trenches in the second dielectric layer by etching the second dielectric layer selectively with respect to the capping layer and the spacer lines of the spacer-provided capped off-center metal lines, the set of trenches comprising:
        a center trench extending along the center track between the spacer-provided capped off-center lines, and
        a first and a second edge trench extending along the first and second edge tracks, respectively, on mutually opposite outer sides of the spacer-provided capped off-center metal lines; and
    forming a center metal line in the center trench, and a first and a second edge metal line in the first and second edge trenches, respectively.

2. The method according to claim 1, wherein the center trench exposes a first spacer line of the first spacer-provided capped off-center metal line and a first spacer line of the second spacer-provided capped off-center metal line.

3. The method according to claim 1, wherein the first edge trench exposes a second spacer line of the first spacer-provided capped off-center metal line and the second edge trench exposes a second spacer line of the second spacer-provided capped off-center metal line.

4. The method according to claim 1, wherein the active regions of the cell comprise a first and a second active region extending in parallel in the first cell direction, the first and second active regions being formed along the first and the second off-center track, respectively, the cell further comprising:
    a first set of contacts formed on source/drain regions of the first active region along the first off-center track;
    a second set of contacts formed on source/drain regions of the second active region along the second off-center track; and
    a set of parallel gate structures extending in the second cell direction and across channel regions of the first and second active semiconductor regions, wherein the first dielectric layer is formed to embed the first and second sets of contacts and the set of gate structures.

5. The method according to claim 4, further comprising:
prior to depositing the metal layer and the capping layer, forming along the first off-center track at least one via opening in the first dielectric layer, the via opening exposing a contact of the first set of contacts;
subsequently depositing the metal layer on the first dielectric layer, wherein the metal layer fills the via opening to form a first metal via in the via opening; and
patterning the metal layer and the capping layer such that the first capped off-center metal line is connected to the contact of the first set of contacts by the first metal via.

6. The method according to claim 4, wherein the first set of contacts comprises an outwardly protruding contact protruding from the first off-center track into the first edge track and the second set of contacts comprises an outwardly protruding contact protruding from the second off-center track into the second edge track, and wherein the first and second edge metal lines are formed in electrical contact with the outwardly protruding contact of the first and second sets of contacts, respectively.

7. The method according to claim 6, wherein forming the first and second edge trenches comprises: forming a trench mask on an upper surface of the second dielectric layer and etching dielectric material exposed by the trench mask until the first edge trench exposes an upper surface portion of the outwardly protruding contact of the first set of contacts and the second edge trench exposes an upper surface portion of the outwardly protruding contact of the second set of contacts, respectively.

8. The method according to claim 4, wherein the first set of contacts comprises an inwardly protruding contact protruding from the first off-center track into the center track and the second set of contacts comprises an inwardly protruding contact protruding from the second off-center track into the center track, and wherein the center metal line is formed in electrical contact with the inwardly protruding contacts of the first and second sets of contacts.

9. The method according to claim 8, wherein forming the center trench comprises: forming a trench mask on an upper surface of the second dielectric layer and etching dielectric material exposed by the trench mask until the center trench exposes an upper surface portion of the inwardly protruding contacts of the first and second sets of contacts.

10. The method according to claim 4, wherein each gate structure of the set of gate structures comprises a gate, a gate cap and a gate sidewall spacer.

11. The method according to claim 10, wherein the gate cap and the gate sidewall spacer are formed of materials different from the first and second dielectric layers.

12. The method according to claim 10, wherein the first dielectric layer is formed with an upper surface flush with an upper surface of the gate caps, and wherein the metal layer is deposited on the upper surface of the first dielectric layer and the upper surface of the gate caps.

13. The method according to claim 1, further comprising:
opening a capping layer line of the second spacer-provided capped off-center metal line to expose at least a portion of a metal line of the second spacer-provided capped off-center metal line; and
removing the at least a portion of the metal line and replacing the removed at least a portion with an insulating material.

* * * * *